United States Patent [19]
Katakura et al.

[11] Patent Number: 5,432,369
[45] Date of Patent: Jul. 11, 1995

[54] INPUT/OUTPUT PROTECTION CIRCUIT

[75] Inventors: Yoshiaki Katakura; Yasuhiro Fukuda, both of Tokyo, Japan

[73] Assignee: Oki Electric Industry Co., Ltd., Tokyo, Japan

[21] Appl. No.: 256,073
[22] PCT Filed: Oct. 28, 1993
[86] PCT No.: PCT/JP93/01557
 § 371 Date: Jun. 23, 1994
 § 102(e) Date: Jun. 23, 1994
[87] PCT Pub. No.: WO94/10705
 PCT Pub. Date: May 11, 1994

[30] Foreign Application Priority Data

Oct. 29, 1992 [JP] Japan ............... 4-291713

[51] Int. Cl.⁶ ............... H01L 29/06; H01L 29/78
[52] U.S. Cl. ............... 257/361; 257/360; 257/362; 257/363
[58] Field of Search ............... 257/356, 360, 361, 362, 257/363, 367

[56] References Cited
U.S. PATENT DOCUMENTS 4,916,085  4/1990  Frisina ............... 257/362
5,349,227  9/1994  Murayama ............... 257/362

FOREIGN PATENT DOCUMENTS 0215493  3/1987  European Pat. Off. .
54-89586  7/1979  Japan .
61-166073A  7/1986  Japan .
62-76676A  4/1987  Japan .

*Primary Examiner*—Ngân V. Ngô
*Attorney, Agent, or Firm*—Spencer, Frank & Schneider

[57] ABSTRACT

In an input/output protection circuit, since the drain of an input protection MOS transistor is directly connected to the cathode of input protection diode and the source and gate of the input protection MOS transistor and the anode of the input protection diode are respectively grounded, an excessive voltage supplied from an external electrode is received by the cathode of the input protection diode and the drain of the input protection MOS transistor before it reaches the internal circuit of a semiconductor device, so that the input/output protection circuit is free from the increase of junction capacitance due to the pattern of the input protection diode. Moreover, when an excessive voltage is input to the device, the input protection diode breaks down prior thereto so as to reduce the voltage at which the input protection MOS transistor starts to conduct. As a result, a high-speed and certain input protection is realized. Furthermore, since the input electrode can be directly connected to the drain of the input protection MOS transistor, the input protection circuit in FIG. 1 is applicable to an output protection circuit so as to certainly protect the internal output circuit by applying the input protection circuit to an output MOS transistor.

6 Claims, 3 Drawing Sheets

INPUT/OUTPUT PROTECTION CIRCUIT

TECHNICAL FIELD

The present invention relates to an input protection circuit for protecting an internal input circuit or to an output protection circuit for protecting an internal output circuit (collectively called an i/o protection circuit hereinafter) when an excessive input voltage is applied to an external electrode of a semiconductor device.

BACKGROUND TECHNOLOGY

A diode and resistors are arranged on the side of the input electrode relative to an input protection MOS transistor for lengthening a rise time of a voltage surge input thereto to cope with an abrupt surge of voltage by way of the time constant of the junction capacitance of the diode and the resistances of the resistors.

The output circuit is substantially identical to the i/o protection circuit for protecting the input circuit which is described above. In case of the output protection circuit, an output MOS transistor itself serves as the output protection MOS transistor. Since the output MOS transistor generally occupies a large area, the protection diode serving as a capacitor is not used.

The conventional input or output protection circuit, however, reacts as a delay element also to normal signals since it is equipped with a protection diode and protection resistors for lengthening the rise time of input voltage. As a result, the transmission of a signal in the input or output circuit is delayed so that speeding up device operation as a whole is prevented. Since miniaturization of and the speeding up of device operation is currently in progress, the above-mentioned delay is not negligible as a factor preventing the speeding up.

The present invention provides an input protection circuit or an output protection circuit which realizes the speeding up of a device operation by solving the problem relating to transmission delay of the signal by the protection diode and protection resistors set forth above.

SUMMARY OF THE INVENTION

In order to solve the above problem, the present invention provides an i/o protection circuit for protecting the internal circuit of a device from an excessive voltage applied from an external electrode, characterized in comprising a terminal connected to the external electrode and internal circuit set forth above, a transistor having a first electrode connected to the above terminal, a grounded second electrode and a grounded control electrode and a diode having one end directly connected to the first electrode of the transistor and the other end grounded, the diode being arranged reversely to the voltage applied to the terminal.

BEST MODE FOR CARRYING OUT THE INVENTION

Figure 1:
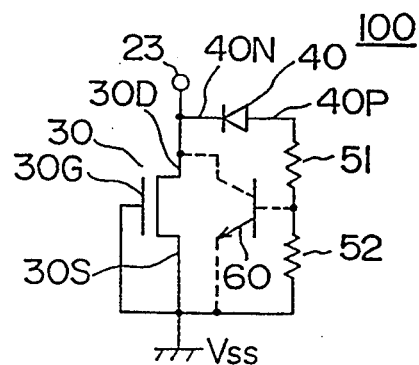
FIG. 1 is a circuit diagram of an i/o protection circuit according to a first embodiment of the present invention.

An i/o protection circuit according to the present invention will be described with reference to drawings. FIG. 1 is a circuit diagram of the i/o protection circuit 100 according to the first embodiment of the present invention.

The operation of the i/o protection circuit 100 illustrated in FIG. 1 serving as an input protection circuit will be described hereinafter. Denoted at 23 is a terminal connected to an input electrode and an input circuit, 30 is an input protection MOS transistor, 40 is an input protection diode, 51 and 52 are parasitic resistors and 60 is a parasitic bi-polar transistor. The cathode of the input protection diode 40, the drain 30D of the input protection MOS transistor 30 and the emitter of the parasitic bi-polar transistor 60 are connected to the terminal 23. The anode of the input protection diode 40 is connected to a ground potential $V_{SS}$ by way of the parasitic resistors 51 and 52. The gate 30G and source 30S of the input protection MOS transistor 30 are connected to the ground potential $V_{SS}$. The base of the parasitic bi-polar transistor 60 is connected to a node between the parasitic resistors 51 and 52 and the collector thereof is connected to the ground potential $V_{SS}$.

Figure 2:
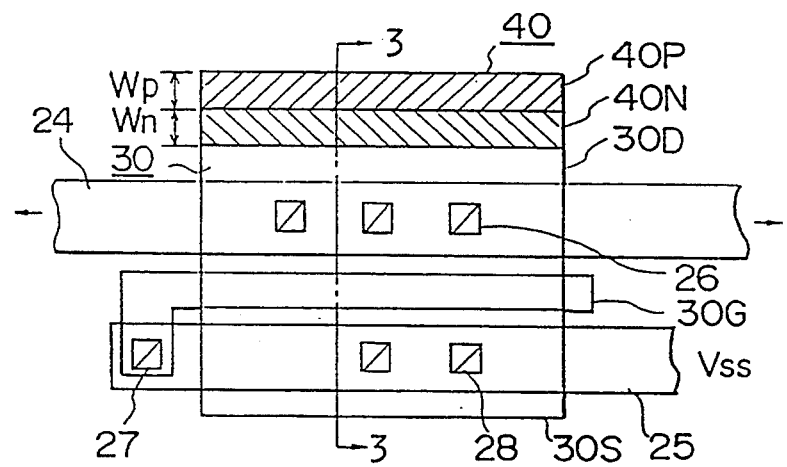
FIG. 2 shows a pattern layout of the i/o protection circuit in FIG. 1.
Figure 3:
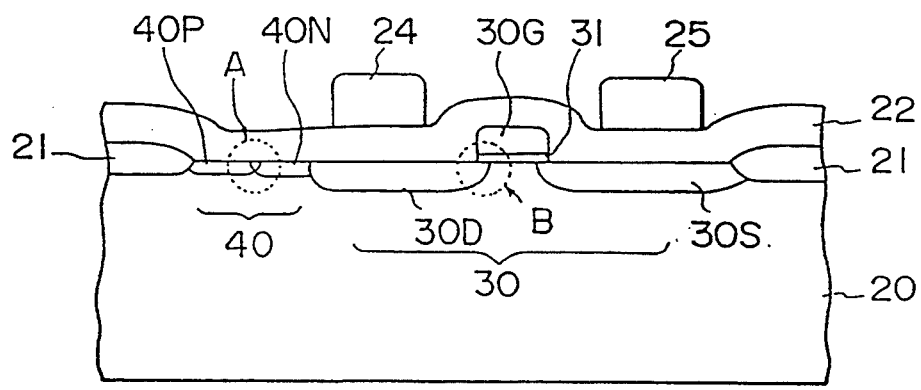
FIG. 3 is a cross-sectional view of FIG. 2 taken along line 3—3.

FIG. 2 shows a pattern layout of the i/o protection circuit 100 in FIG. 1 and FIG. 3 is a cross-sectional view of FIG. 2 taken along line 2—2. In FIGS. 2 and 3, the input protection MOS transistor 30 and input protection diode 40 are formed in a region surrounded by a field insulating film 21 for separating elements on a p-type substrate 20. That is, the input protection MOS transistor 30 comprises the source 30S and drain 30D each formed of n-type diffusion layer spaced away from each other by a given distance. The gate 30G made of polycide etc. is formed on the p-type substrate between the source 30S and drain 30D by way of a gate insulating film 31. The input protection diode 40 is made of a p-type diffusion layer 40P which is lower in density then the drain 30D and an n-type diffusion layer 40N connected to the p-type diffusion layer 40P. The n-type diffusion layer 40N is connected to the drain 30D. An insulating film 22 is formed over the input protection MOS transistor 30, input protection diode 40 and field insulating film 21. Metal wirings 24 and 25 of Al or Al alloy etc. are formed on the insulating film 22. The metal wiring 24 is connected to the drain 30D by way of a contact 26. The metal wiring 24 is also connected to the input electrode and input circuit. That is, the terminal 23 in FIG. 1 corresponds to the metal wiring 24 (or the contact 26). The metal wiring 25 is connected to the gate 30G by way of a contact 27 and to the source 30S by way of a contact 28. The metal wiring 25 is also connected to the ground potential $V_{SS}$. The base input of the parasitic bi-polar transistor 60 is the p-type substrate on which the input protection MOS transistor 30 is formed, the emitter thereof is the source 30S and the emitter thereof is the drain 30D, while the parasitic resistors 51 and 52 are formed on the p-type substrate.

Denoted at A and B in FIG. 3 are portions having low breakdown voltage.

Suppose that the secondary breakdown voltage of the input protection MOS transistor 30 (the breakdown voltage between the collector and emitter of the parasitic bi-polar transistor 60) is BV and that between the source and drain of the input protection MOS transistor 30 is $BV_{SD}$. Likewise suppose that the breakdown voltage of the input protection diode 40 is $BV_D$. The p-type diffusion layer 40P and n-type diffusion layer 40N which constitute the input protection diode 40 are designed in density and in the widths $W_n$ and $W_p$ thereof to meet the following inequality: $BV < BV_D < BV_{SD}$.

For example, supposing that the impurity density of the input protection MOS transistor 30 is $8 \times 10^{16}$ ions/cm$^3$, the thickness of the gate insulating film 31 thereof is 200 Å and the gate length thereof is 0.8 μm, $BV_{SD} \approx 13$ V and $BV \approx 9$ V are established. If the impurity density of each of the n-type diffusion layer 40N and p-type diffusion layer 40P which constitute the input protection diode 40 is $5 \times 10^{17}$ ions/cm$^3$, $BV_D \approx 11$ V is established in case $W_n$, $W_p > 0.25$ μm so that the above condition can be met.

The operation of the i/o protection circuit 100 according to the present invention will be described with reference to drawings hereinafter.

Figure 4C:
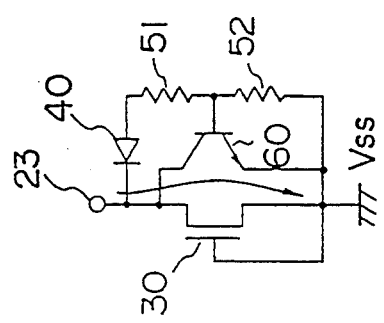
FIGS. 4a, 4b and 4c are circuit schematics for explaining the operation of the i/o protection circuit in FIG. 1.
Figure 4B:
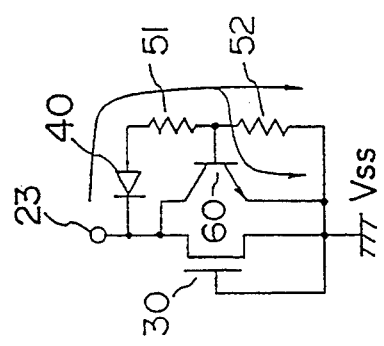
Figure 4A:
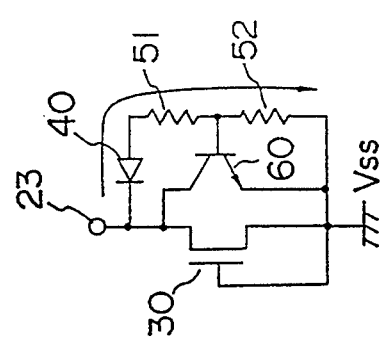

The FIG. 4 series of drawings are helpful for explaining the operation of the i/o protection circuit 100 according to the present invention, wherein FIG. 4a, FIG. 4b and FIG. 4c show the breakdown state of the input protection diode 40, the operating state of the parasitic bi-polar transistor 60 and the conductive state of the input protection MOS transistor 30 respectively.

At first, as illustrated in FIG. 4a, when an excessive voltage such as electrostatic surge etc. is input to the input electrode, the input voltage is applied to the drain 30D by way of the metal wiring 24 and contact 26. When the excessive voltage is applied to the drain 30D, the portion A illustrated in FIG. 3 of the input protection diode 40 having low breakdown voltage breaks down so that electric current starts flowing therethrough. The current flows to the source 30S or the ground electrode by way of the p-type substrate 20.

The current raises the voltage of the base (which corresponds to the p-type substrate 20) of the parasitic bi-polar transistor 60 by way of the parasitic resistors 51 and 52 as illustrated in FIG. 4b. As a result, current flows between the source and drain of the input protection MOS transistor 30 due to the amplifying operation of the parasitic hi-polar transistor 60.

When current flows between the source and drain of the input protection MOS transistor 30, the input protection MOS transistor 30 consequently becomes conductive at a source-drain voltage lower than the source-drain breakdown voltage $BV_{SD}$ thereof. The conductive state of the input protection MOS transistor 30 causes the drop of the source-drain voltage as low as the secondary breakdown voltage BV. As a result, the input electricity consumes its power therein.

As described above according to this embodiment, since the input protection diode 40 is provided in such a way as to be connected to the drain 30D of the input protection MOS transistor 30 adjacent thereto, the input protection diode 40 is free from the increase of junction capacitance due to the pattern thereof. Moreover, if an excessive voltage is input, the input protection diode 40 breaks down prior to the input protection MOS transistor 30 to lower the voltage at which the input protection MOS transistor 30 starts to conduct, so that it is possible to lower the voltage applied to an input circuit 2 inside the element. As a result, certain input protection is possible without obstructing the speed-up of operation of elements.

Furthermore, since the input electrode can be directly connected to the drain 30D of the input protection MOS transistor 30, the input protection circuit in FIG. 1 is applicable to the output protection circuit, so that an internal output circuit can be protected certainly by applying the input circuit to the output MOS transistor.

The present invention is not limited to the above embodiments. Modifications thereof will be described hereinafter.

Figure 5:
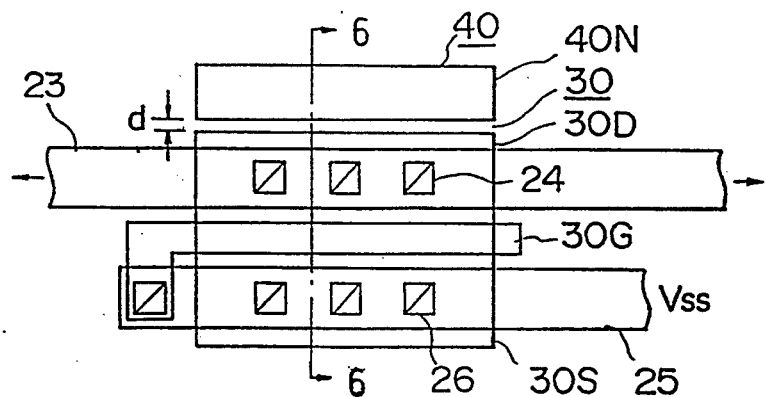
FIG. 5 shows a pattern layout of the i/o protection circuit according to a second embodiment of the present invention.
Figure 6:
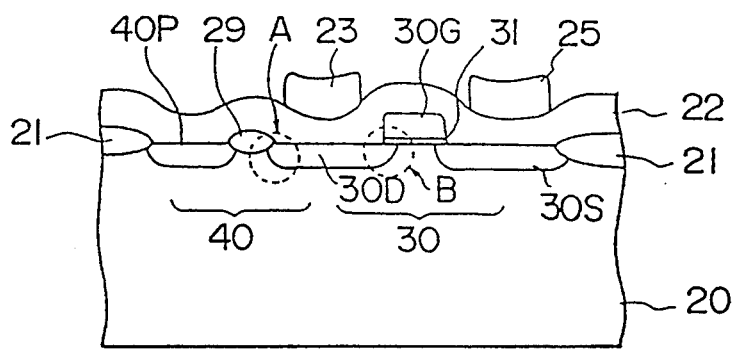
FIG. 6 is a cross-sectional view of FIG. 5 taken along line 6—6.

FIG. 5 shows the pattern layout of the input protection circuit according to a second embodiment of the present invention and FIG. 6 is a cross-sectional view of FIG. 5 taken along line 6—6.

In this embodiment, the n-type diffusion layer 40N that was one of the constituents of the input protection diode 40 in the first embodiment is omitted and the drain 30D of the input protection MOS transistor 30 is used in place of that. A p-type diffusion layer 40P is formed by providing an element separating region 29 made of field insulating film having a given width of d μm between the drain 30D and itself. The p-type diffusion layer 40P and the n-type diffusion layer of the drain 30D form the input protection diode 40. The width d μm is set also in this example so that the breakdown voltage $BV_D$ of the input protection diode 40 may meet the following inequality: $BV < BV_D < BV_{SD}$.

For example, $d = 0.4$ μm + α must be established to meet the condition $BV_D \approx 11$ V, wherein α represents the lateral extension of the drain 30D and the p-type diffusion layer 40P of the input protection diode 40. Accordingly, supposing that the n-type diffusion layer of the drain 30D and p-type diffusion layer 40P have a common depth of 0.25 μm and the lateral extension is about 8% of the depth of the junction, the lateral extension can be roughly approximated to: $\alpha = 0.4$ μm. As a result, if the width $d = 0.8$ μm is established, it is possible to set the target breakdown voltage $BV_D$.

A similar effect can be obtained also in the second embodiment by performing the similar operation in the first embodiment illustrated in FIG. 1. Since the input electrode is directly connected to the drain 30D also in this embodiment, it is also applicable to the output MOS transistor as an output protection circuit.

Figure 7:
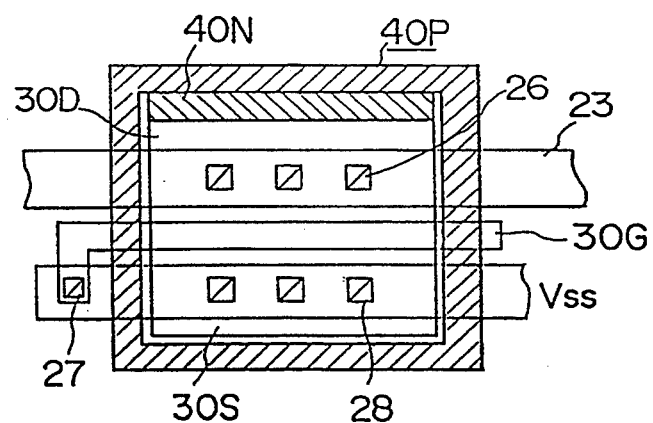
FIG. 7 shows a pattern layout for explaining the i/o protection circuit according to a third embodiment of the present invention.

It is desirable to previously set the resistance of the parasitic resistor 51 as large as possible and that of the parasitic resistor 52 as small as possible in FIG. 1. By doing so, the voltage of the node between the parasitic resistors 51 and 52, i.e., the voltage applied to the base of the parasitic bi-polar transistor 60 can faster reach the breakdown voltage BV between the collector and emitter thereof so that the parasitic bi-polar transistor 60 can operate more easily. Moreover, it is possible to increase the current amplification factor $h_{fe}$ of the parasitic bi-polar transistor 60 and reduce the secondary breakdown voltage BV thereof. As a result, it is possible to improve the electrostatic breakdown resistance of the i/o protection circuit. In order to make the resistance of the parasitic resistor 51 as small as possible and that of the parasitic resistor 52 as large as possible, the p-type diffusion layer 40P which forms the input protection diode 40 is formed in such a way as to surround the drain 30D and source 30S which form the input protection MOS transistor 30 so as to be of low impedance as illustrated in FIG. 7 and a resistor element made of diffusion resistors etc. is formed instead of the parasitic resistor 52.

Although the p-type substrate is used in the above embodiment, it is also possible to provide p-type well regions in an n-type substrate and form i/o protection MOS transistor and i/o protection diode therein. In this case, the ground potential is applied to the n-type diffusion layer used as a source. In this arrangement, since the p-type well regions are floating so that the parasitic resistance becomes infinite, the parasitic bi-polar transistors is easily operable. The n-type diffusion layers forming the source and drain of the input protection MOS transistor, the p-type well layer and the n-type substrate form a parasitic bi-polar transistor also in this case to contribute to the input protection particularly at the parasitic bi-polar transistor formed on the source side, causing the further improvement of the protecting ability.

Various other modifications are possible such as changing the conductive polarity of the i/o protection MOS transistor and i/o protection diodes, using a pattern layout other than that illustrated in the drawings, etc.

INDUSTRIAL UTILIZATION

As described above in detail according to the present invention, an input protection diode in which the breakdown voltage $BV_D$ thereof meets the inequality $BV < BV_D < BV_{SD}$ has one end thereof connected to the drain of an input protection MOS transistor connected to an external electrode and the other end thereof connected to a constant potential by way of a resistor together with the source of the input protection MOS transistor. Consequently there is no increase of junction capacitance due to the pattern of the input diode. Moreover, when an excessive voltage is input thereto, the input protection diode breaks down prior to the i/o protection circuit to reduce the voltage value at which the input protection MOS transistor starts to conduct. As a result, it is possible to lower the voltage applied to the input circuit inside the element. As a result, certain input protection is possible without obstructing the speed up of operation of elements.

Since the input electrode can be directly connected to the drain of the input protection MOS transistor, the input protection circuit is applicable to an output protection circuit so as to certainly protect an internal output circuit by applying the input protection circuit to an output MOS transistor.

We claim:

1. An input/output protection circuit for protecting internal circuits from an excessive voltage applied from an external electrode, comprising:
   a terminal connected to said external electrode and said internal circuits;
   a transistor having a first electrode connected to said terminal, a grounded second electrode and a grounded control electrode; and
   a diode having one end directly connected to said first electrode of said transistor and the other end grounded, said diode being arranged reversely to said voltage applied to said terminal; wherein
   said first electrode and said second electrode of said transistor are formed in a substrate of first conductive type as a first and second diffusion layers of second conductive type respectively; and
   said diode is formed in said substrate and is composed of a third diffusion layer of first conductive type which is lower in density than said substrate and a fourth diffusion layer of second conductive type which is lower in density than said first diffusion layer, and said third and fourth diffusion layers are set in density and width in such a manner that the breakdown voltage $BV_D$ of said diode is smaller than the breakdown voltage $BV_{SD}$ of said transistor.

2. An input/output protection circuit according to claim 1, wherein said first diffusion layer of said transistor and said fourth diffusion layer of said diode are connected to each other.

3. An input/output protection circuit, comprising:
   a substrate of first conductive type;
   first and second diffusion layers of second conductive type which are formed on a surface of said substrate and adjacent thereto being spaced away from each other by a given interval;
   a third diffusion layer of second conductive type which is formed on the surface of said substrate and adjacent thereto to be connected to said first diffusion layer and is lower in density than said substrate;
   a fourth diffusion layer which is formed on the surface of said substrate and adjacent thereto and is lower in density than said substrate;
   a gate electrode formed between said first and second diffusion layers on said substrate;
   an insulating film formed on said substrate over said first and said third diffusion layers and said gate electrode;
   a first metal wiring which is formed on said insulating film and is connected to said first diffusion layer through said insulating film; and
   a second metal wiring which is formed on said insulating film and is connected to said gate electrode and said second diffusion layer through said insulating film; wherein
   said insulating film and said third diffusion layer are set in width and density in such a manner that the breakdown voltage $BV_D$ of a diode composed of said third and fourth diffusion layers is smaller than the breakdown voltage $BV_{SD}$ of a transistor composed of said first and second diffusion layers and said gate electrode.

4. An input/output protection circuit according to claim 3, wherein a ground potential is applied to said second metal wiring.

5. An input/output protection circuit, comprising:
   a substrate of first conductive type;
   first and second diffusion layers of second conductive type which are formed on a surface of said substrate and adjacent thereto being spaced away from each other by a given distance;
   a third diffusion layer of first conductive type which is formed on the surface of said substrate and adjacent thereto and is lower in density than said substrate;
   a first insulating film having a given width which is formed on said substrate between said first and third diffusion layers;
   a gate electrode which is formed over said substrate between said first and second diffusion layers;
   a second insulating film which is formed on said substrate to cover said first and second diffusion layers and said gate electrode;

a first metal wiring which is formed on said second insulating film and is connected to said first diffusion layer through said second insulating film; and a second metal wiring which is formed on said second insulating film and is connected to said gate electrode and said second diffusion layer through said second insulating film; wherein the width of said first insulating film and the density of said third diffusion layer are set in such a manner that the breakdown voltage $BV_D$ of a diode composed of said first and third diffusion layers is smaller than the breakdown voltage $BV_{SD}$ of a transistor composed of said first and second diffusion layers and said gate electrode.

6. An input/output protection circuit according to claim 5, characterized in that the ground potential is applied to said second metal wiring.

* * * * *